(12) United States Patent
Barber et al.

(10) Patent No.: US 6,497,734 B1
(45) Date of Patent: Dec. 24, 2002

(54) APPARATUS AND METHOD FOR ENHANCED DEGASSING OF SEMICONDUCTOR WAFERS FOR INCREASED THROUGHPUT

(75) Inventors: Kenneth K. Barber, San Jose, CA (US); Mark Fissel, Danville, CA (US); Soo Yun Joh, Livermore, CA (US); Mukul Khosla, San Jose, CA (US); Karl B. Levy, Los Altos, CA (US); Robert Martinson, San Mateo, CA (US); Michael Meyers, Freemont, CA (US); Dhairya Shrivastava, Los Altos, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/037,026

(22) Filed: Jan. 2, 2002

(51) Int. Cl.[7] ............................................. H01L 21/324
(52) U.S. Cl. ...................... 29/25.01; 438/795; 438/908; 438/909
(58) Field of Search .......................... 29/25.01; 438/795, 438/908, 909

(56) References Cited

U.S. PATENT DOCUMENTS

| | | | |
|---|---|---|---|
| 5,019,233 A | * | 5/1991 | Blake et al. ............ 204/192.12 |
| 5,147,823 A | | 9/1992 | Ishibashi et al. |
| 5,248,636 A | | 9/1993 | Davis et al. |
| 5,352,248 A | * | 10/1994 | Ishikawa et al. ........... 29/25.01 |
| 5,380,682 A | | 1/1995 | Edwards et al. |
| 5,388,944 A | | 2/1995 | Takanabe et al. |
| 5,435,683 A | | 7/1995 | Ooswa et al. |
| 5,674,786 A | * | 10/1997 | Turner et al. ............... 437/225 |
| 5,925,227 A | * | 7/1999 | Kabayashi et al. .... 204/298.25 |
| 6,093,654 A | * | 7/2000 | Koyama ..................... 438/715 |
| 6,110,232 A | | 8/2000 | Chen et al. |
| 6,224,679 B1 | | 5/2001 | Sasaki et al. |
| 6,254,328 B1 | | 7/2001 | Wytman |
| 6,310,328 B1 | * | 10/2001 | Gat ............................ 219/411 |

* cited by examiner

Primary Examiner—Olik Chaudhuri
Assistant Examiner—Stephen W. Smoot
(74) Attorney, Agent, or Firm—DeLio & Peterson, LLC; Robert Curcio

(57) ABSTRACT

A multi-level shelf degas station relying on at least two heaters integrated within wafer holding shelves or slots, where the semiconductor wafers do not have direct contact with the heater shelves. The heaters provide conduction heating. In order to degas a wafer, the heater and wafer holder assembly is positioned in a sequential manner through each wafer slot to the next available slot. If a degassed wafer exists in the slot, a transfer chamber arm removes it. A loader arm then places a wafer in the available, empty slot and the stage is moved upwards to receive the wafer from the loader arm. The transfer chamber arm removes an individual wafer from the heater and wafer holder assembly allowing the removed wafer to be individually processed while the other wafers remain in the heater and wafer holder assembly. In some instances, a loader arm may also remove wafers. The remaining wafers in the heater and wafer holder assembly are subjected to further degas treatment while the wafer(s) removed by the transfer chamber arm are exposed to other process steps. Air-cooling chambers are employed to facilitate cooling the wafer slots for ease of removal and maintenance.

28 Claims, 6 Drawing Sheets

APPARATUS AND METHOD FOR ENHANCED DEGASSING OF SEMICONDUCTOR WAFERS FOR INCREASED THROUGHPUT

BACKGROUND OF THE INVENTION

1. Field of the Invention

The present invention relates to an apparatus and method for manufacturing integrated circuits. More specifically, the present invention relates to an apparatus and method to enhance wafer throughput in semiconductor device processing.

2. Description of Related Art

Pre-processing is commonly performed on semiconductor wafers to remove surface and absorbed impurities such as water vapor and other gases from the silicon wafers. If left to reside on and within the wafer, these impurities may result in defects in the integrated circuit. It has been established that gases and water vapor may be removed from the wafers by heating or baking the wafer at some elevated, predetermined temperature in a vacuum for a specified period of time.

Current wafer processing tools have focused on batch processing of multiple wafers, utilizing a single robotic arm for insertion and removal of the wafers from their holder or cassette. The wafers undergo radiated heat treatment in batch quantities, typically by exposure to heat from quartz lamps radiated through a transparent partition in a vacuumed chamber. The wafers are heated in bulk as a single process step. Prior designs teach of using the wafer carrier together with a load lock and vacuum wafer transport mechanism at more than one process module to provide a complete low-particulate wafer transfer system. However, the inherent design of these systems requires the wafers to be processed and heated in batch.

For example, in U.S. Pat. No. 5,388,944 issued to Takanabe, et al., on Feb. 14, 1995, entitled "VERTICAL HEAT-TREATING APPARATUS AND HEAT-TREATING PROCESS BY USING THE VERTICAL HEAT-TREATING APPARATUS," a wafer loading and unloading chamber is taught for introducing wafers to a heat treatment section of a process tool. A plurality of wafers are loaded in a target object assembly or wafer cassette and inserted into a vertical-type reaction tube within which batch wafer heat-treatment is performed. A conveying apparatus, specifically a single robotic arm provided in a first load lock chamber, transports the wafers into and out of the reaction tube. A second load lock chamber secures and removes the wafers.

Similarly, in U.S. Pat. No. 5,380,682 issued to Edwards, et al., on Jan. 10, 1995, entitled, "WAFER PROCESSING CLUSTER TOOL BATCH PREHEATING AND DEGASSING METHOD," a wafer processing cluster tool having one or more load-locks is taught with batch pre-heating modules that receive wafers from a cluster tool transport module. A pair of modules are operated such that one module can be initially loaded with wafers from the transport module and then heated as a batch. While this heating is taking place, the second preheat module or degas chamber can be loaded in a similar fashion with a second batch of wafers. After the first batch of wafers has been heated, the wafers from it are transferred to other processing stations and then transferred to a load-lock for removal.

The prior art designs have increased throughput to the semiconductor process by adding an additional wafer degas chamber to the cluster tool. However, these designs promote batch processing, which requires a station to be completely unloaded before reloading. Moreover, by using a batch process, each wafer in a loaded cassette must be degassed concurrently, and in a single process step. Furthermore, by utilizing radiated heat in a batch process, typically by employing quartz lamps, the prior art designs are not well-suited for uniform wafer heating, as the stacked wafers will tend to shield radiated energy from adjacent wafers.

Bearing in mind the problems and deficiencies of the prior art, it is therefore an object of the present invention to provide an apparatus and process for degas of semiconductor wafers that does not rely on batch processing of the wafers.

It is another object of the present invention to provide an apparatus and process for degas of semiconductor wafers that promotes a sequential process, dividing the total degassing time over a number of cycles for each wafer.

A further object of the invention is to provide an apparatus and process for degas of semiconductor wafers utilizing a pass-through configuration that allows for the simultaneous exchange of wafers.

Another object of the invention is to provide an apparatus and process for degas of semiconductor wafers that uniformly heats wafers vertically aligned in their holders.

Still other advantages of the invention will in part be obvious and will in part be apparent from the specification.

SUMMARY OF THE INVENTION

The above and other objects, which will be apparent to those skilled in art, are achieved in the present invention which is directed to in a first aspect, a method of degassing semiconductor wafers in a multi-station degas apparatus, comprising: lowering a heater and wafer holder assembly stack having slots for individual semiconductor wafers into a transfer/load chamber; loading a wafer into the heater and wafer holder assembly slot; removing at least one wafer from the heater and wafer holder assembly slot, such that the removed wafer may be individually processed while other wafers remain in the heater and wafer holder assembly; and, positioning the heater and wafer holder assembly into a degas chamber for degas treatment while the at least one removed wafer is exposed to other process steps in other stations of the multi station degas apparatus.

This method further comprises monitoring the temperature inside the slots through thermocouple channels from the heater and wafer holder assembly stack, monitoring and displaying the temperature using a user interface electrical connection. Removing a wafer comprises removing a single wafer at a time using a transfer robotic arm and a load robotic arm.

In a second aspect, the present invention is directed to a method of degassing semiconductor wafers in a multi-station degas apparatus, comprising: positioning a heater and wafer holder assembly stage having a plurality of wafer slots in a sequential manner through each of the wafer slots to the next available wafer slot; removing a first of a plurality of wafers from one of the wafer slots using a transfer robotic arm after the wafer has been subjected to a degas treatment in a degas chamber; re-positioning the heater and wafer holder assembly stage to receive a second wafer from the loader robotic arm; loading the second wafer in an available wafer slot using the loader robotic arm after the first wafer has been removed; retracting the robotic arms; sealing the heater and wafer holder assembly stage into the degas chamber; and degassing the second wafer in the heater and wafer holder assembly while the first wafer is subjected to other process stations within the multi-station degas apparatus.

The degassing of the wafers further comprises: closing a vacuum pump isolation valve; introducing process gases; initiating a timer; controlling pressure in the degas chamber; and, opening a by-pass valve after the degas chamber reaches a predetermined internal pressure.

In a third aspect, the present invention is directed to a multi-station degas apparatus for semiconductor wafer processing, comprising: a process degas chamber; a load/transfer chamber; a heater and wafer holder assembly stack having a plurality of slots, the heater and wafer holder assembly stack positionable within the degas chamber and the load/transfer chamber; a conduction heater in each of the plurality of slots for individual conduction heating of the wafers, a vertical motion bar and platform capable of moving the heater and wafer holder assembly stack to and from the chambers; at least two robotic arms for placing and removing wafers from the heater and wafer holder assembly stack; gas inlets for introducing process gases to the degas chamber; an o-ring positioned to seal the heater and wafer holder assembly stack and the platform when the heater and wafer holder assembly stack is raised into the degas chamber; a turbo-pump to extract water vapor and other contaminants from the degas chamber; and, pressure, temperature and positioning control devices.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–6 of the drawings in which like numerals refer to like features of the invention.

This invention describes an apparatus and process to improve wafer throughput in cluster tools by using a multi-level shelf degas station. The process is sequential and divides up the total degassing time for each wafer over a number of cycles. This has two advantages over a batch system. First, by dividing the process into cycles that are defined by the desired throughput cycle time, higher throughput is achieved. Second, each wafer is sequenced through the degas process in the same manner so that the process remains consistent. By utilizing a pass-through configuration that is accessed by more than one robotic arm, the apparatus allows for simultaneous exchanges and does not require a station to be completely unloaded before reloading. In addition, because the apparatus is a pass-through configuration and the process is sequential and cyclical, the design requires fewer heater and wafer holder assembly slots than that required for batch processing. Air cooling for rapid cool down also facilitates the process.

In order to achieve uniform heating of the wafers, the design relies on at least two heaters and more preferably a plurality of heaters, integrated within wafer holding shelves, where the semiconductor wafers do not have direct contact with the heater shelves. The heaters are situated to provide both radiation and conduction heating. Conduction heating is advantageous for low dielectric materials where degas times are typically on the order of minutes or longer due to the thermal requirement of operating the degas process at low temperatures, compared to conventional degassing of more thermally-stable films such as $SiO_2$. This multi-station design is proposed with multiple parallel shelves in a wafer holder that supports an unclamped wafer, permitting low front side and backside particle defects.

The preferred process serves to thermally desorb water from the dielectric films and desorb volatile surface contaminants from structure such as on the bottom of vias. An efficient degas process and hardware design ensures, in part, the following: (a) adequate wetting of via sidewalls for subsequent metal deposition; (b) low via and chain resistance through removal of volatiles and water; and (c) a high wafer throughput.

The heating method and pumping apparatus are designed to provide efficient water and contaminant removal from typical low-dielectric material, and to permit a degassed wafer throughput on the order of seventy-five (75) to one hundred twenty (120) wafers per hour depending on the embodiment.

Figure 1:
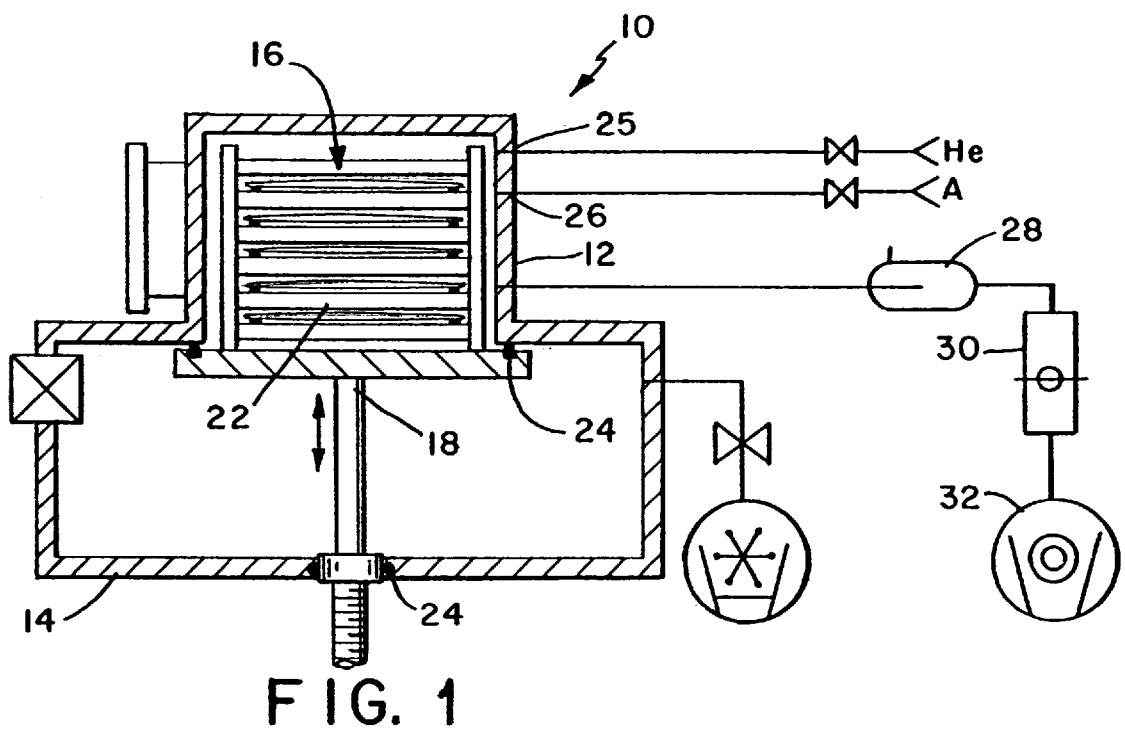
FIG. 1 is a drawing of the multi-station degas apparatus with wafers shown in the process degas chamber.

FIG. 1 depicts the multi-station degas apparatus 10 during the degas process. This apparatus comprises two distinct chambers, a process degas chamber 12, and a load/transfer chamber 14. As indicated, a heater and wafer holder assembly 16 is situated on a vertical motion bar and platform 18, and shown in the upper or sealed position. The wafers are located individually and unclamped on separate shelves of a multi-station heater 22, which is designed for conduction heating and may also facilitate radiation heating. O-ring seals 24 are used to maintain vacuum and separate the process degas chamber 12 environment from the load/transfer chamber 14 environment when the vertical motion bar 18 raises heater and wafer holder assembly 16 in the sealed position. Input ports 25, 26 are made available for the introduction of helium and argon gases, respectively. A water trap 28 with butterfly valve 30 and turbo-pump 32 are used to extract water vapor and other contaminants from the chamber during vacuum pumping. Devices for pressure control, temperature control, and positioning of the stage (not shown), typically employed for these chambers, are also used in conjunction with the above.

Figure 7:
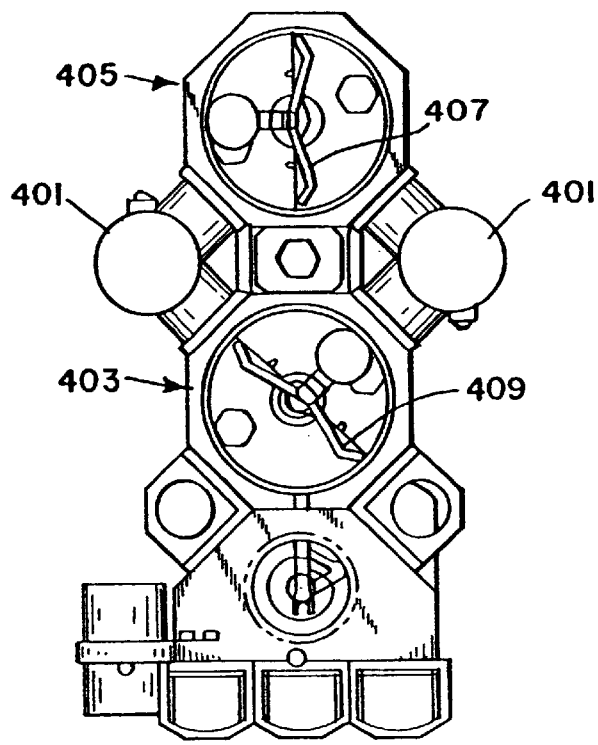
FIG. 7 is a diagram of a second embodiment of the multi-station degas apparatus.

In another embodiment, a point-of-use (POU) rough pump may be employed to pump down the chamber before a vacuum valve is open. FIG. 7 depicts a 300 mm degas apparatus. This is a larger apparatus capable of 120 wafer per hour throughput.

Figure 2:
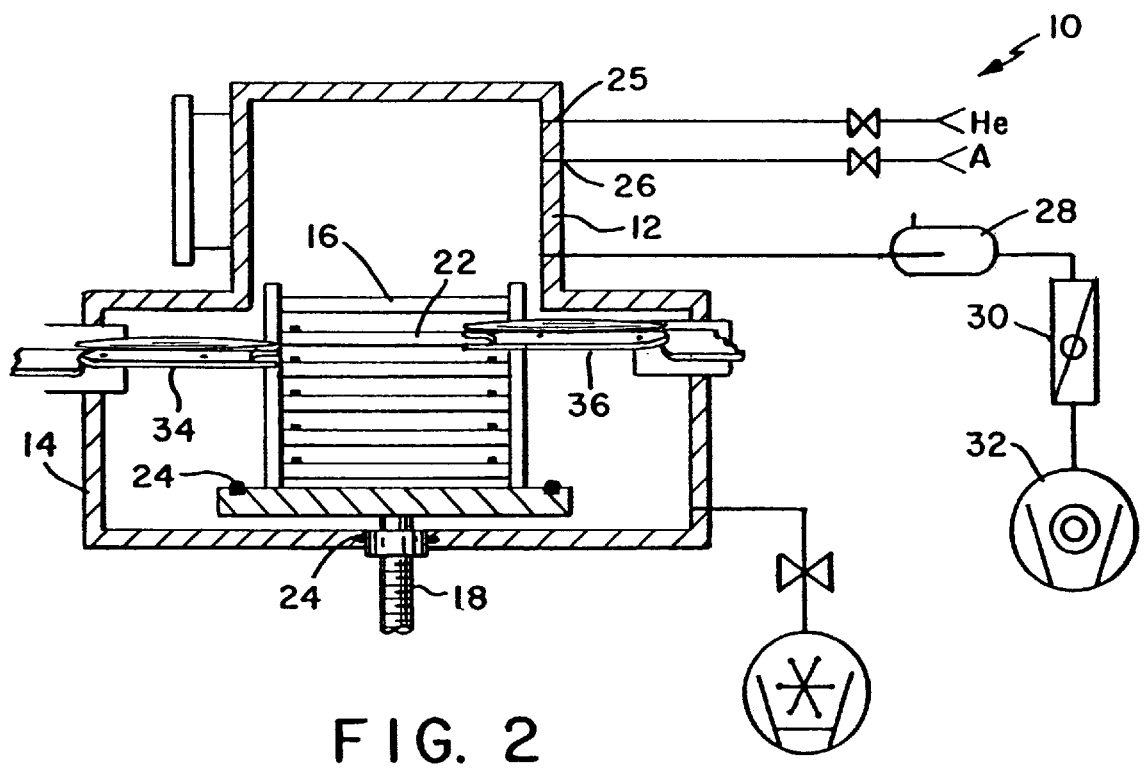
FIG. 2 is a drawing of the multi-station degas apparatus during wafer placement from the load/transfer chamber.

FIG. 2 depicts the multi-station degas apparatus 10 during wafer placement from the load/transfer chamber 14. At this stage, the heater and wafer holder assembly 16 is lowered by the vertical motion bar 18 into the lower or home position. A loader robotic arm 34 is shown loading a wafer onto heater and wafer holder assembly 16, a single wafer at a time. A transfer chamber arm 36 is shown removing an individual wafer from the heater and wafer holder assembly, such that this removed wafer may be individually processed while the other wafers remain in the heater and wafer holder assembly 16. Importantly, the remaining wafers may be subjected to further degas treatment while the wafer(s) removed by the transfer chamber arm 36 are exposed to other process steps.

Figure 3:
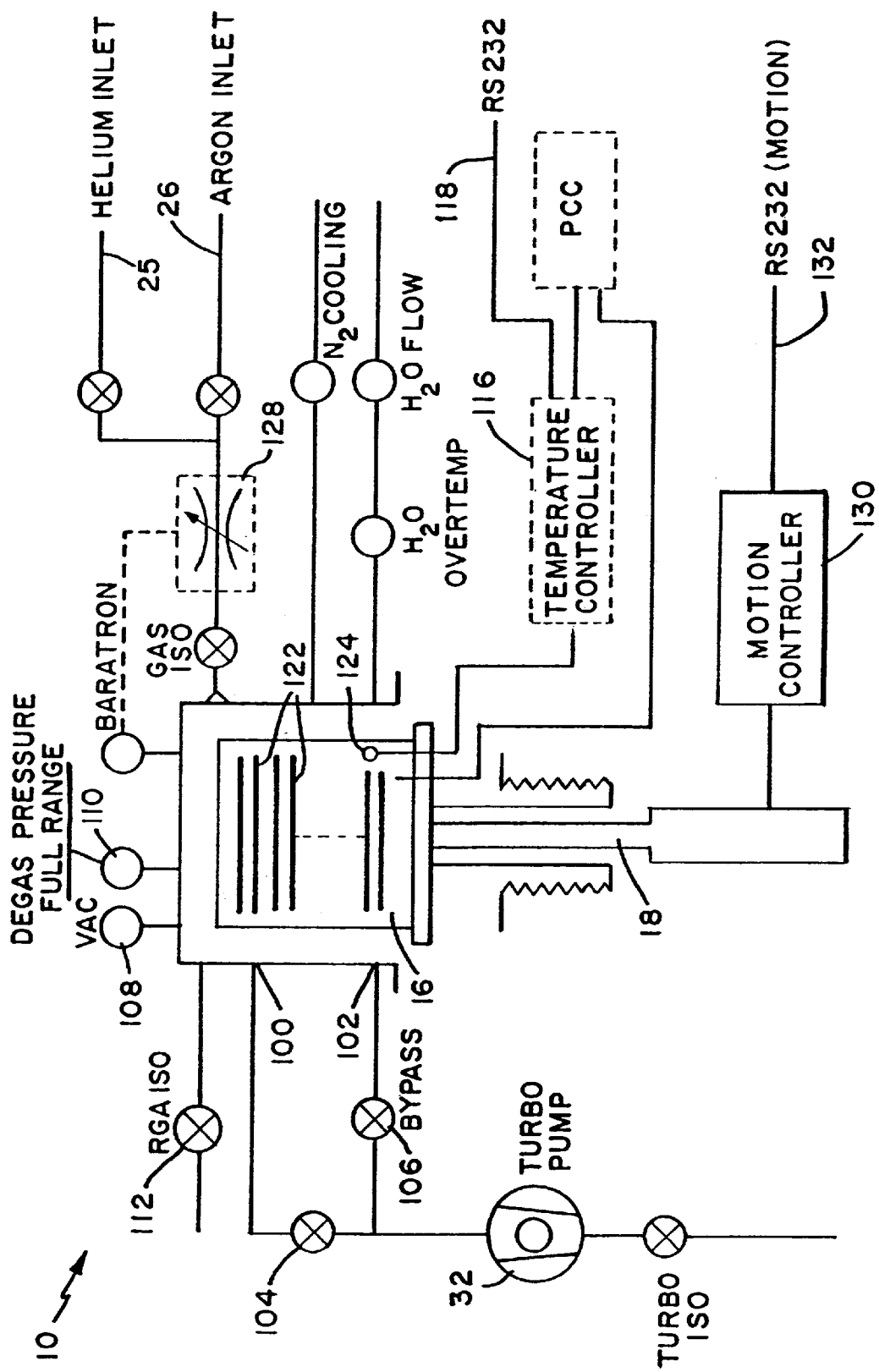
FIG. 3 is a system schematic diagram of the multi-station degas apparatus.

FIG. 3 represents a system schematic of the multi-station degas apparatus 10. The system includes devices for pressure control, temperature control, and positioning of the stage. The station is turbo pumped through two pumping ports. A main port 100, which is isolated by a poppet valve 104, pumps with the rated speed of the turbo-pump 32. A bypass port 102, which also has a valve 106, pumps at a much reduced speed and is used to pump the chamber while the process gas is flowing at the desired process pressure. The bypass valve 106 may also be used when pumping the chamber from high pressures without causing large pressure disturbances. The chamber also includes a vacuum gauge 108 with a range of ambient pressure to high vacuum, and a process manometer 110 for controlling pressure. The provision for an RGA 112 may be provided for photo-resist and other contaminant detection. The RGA 112 functions as a real time safety monitor and interlock to prohibit the station from processing wafers that contain contaminants.

A temperature controller 116 controls the temperature of the stage. An RS-232 I/O port 118 is provided for communication to the temperature controller. The heater and wafer holder assembly or stack 16 consists of a heater stack with a plurality of individual heater plates 122. The heater plates 122 are powered by a single power input or multiple individual power inputs to the heater and wafer holder assembly or stage 16. This allows for a closed loop control based on the input from a single thermocouple 124 or individual thermocouples. A thermocouple channel is provided for each heater plate 122. All thermocouple channels are monitored and displayed on a user interface. Each channel is provided with over-temperature protection. Thus, each heater may have its own heater wires, at least one but possibly more than one thermocouples, and air cooling lines. The air cooling lines allow for quick cool-down cycle time for timely maintenance.

A pressure controller 128 controls the gas flow that is introduced to the chamber. The pressure controller has an integrated manometer that supplies the signal for the closed loop control. The manometer pressure is presented as an output that is adapted to be monitored by software.

Preferably, the stage has six stations for degassing and processing wafers, a sealed position, and a home position. Both the loader robotic arm 34 and the transfer chamber arm 36 are capable of accessing each station. This requires two known positions at each station to load and unload wafers to the loader robot. A motion controller 130 controls the servo positioning. The motion controller is communicated through an RS-232 port 132.

Degas Process Sequence

The multi-station degas apparatus is an unclamped thermal process which relies primarily on conduction heat transfer to couple heat energy to each wafer. Conduction heat transfer between the unclamped wafer and heated shelf is dominant at higher internal pressure on the order of 1 Torr and above. To achieve this pressure, the wafers to be degassed are first isolated in chamber 12, and gas is introduced, preferably helium and argon, to achieve the process pressure.

In order to degas a wafer, the apparatus positions the stage 16 in a sequential manner through each wafer slot to the next available slot. If a degassed wafer exists in the slot, the transfer chamber arm 36 removes it. The loader arm 34 then places a wafer in the available, empty slot and the stage is moved upwards to receive the wafer from the loader arm 34. When each robotic arm 34, 36 is retracted from the degas station, the stage moves up to the seal position (as depicted in FIG. 1), isolating the degas chamber 12 from the load/transfer chamber 14. As the stage 16 moves up to the seal position, the vacuum pump isolation valve 104 is closed. Once isolated, the process gases, preferably helium and argon, are introduced, raising the pressure within the chamber 12. These gases are introduced through inlets 24 and 26, respectively. A closed loop pressure controller 128 controls the chamber 12 pressure. When the chamber reaches the desired, predetermined pressurization, bypass valve 106 is opened, which allows the pressure controller 128 to regulate the chamber 12 pressure at the desired level, and to facilitate in pumping away or removing any process residuals. A timer (not shown) is activated when the process gases are introduced. When a predetermined programmed time at pressure has elapsed, the flow of gas is terminated and the vacuum valve 104 is opened to remove the gas from the gas filled chamber 12. This activity ceases when a predetermined transfer pressure is obtained within the chamber 12. The stage 16 is then lowered to the position of the next completed wafer. The cycle is repeated until the desired number of degas cycles has been attained.

Figure 4:
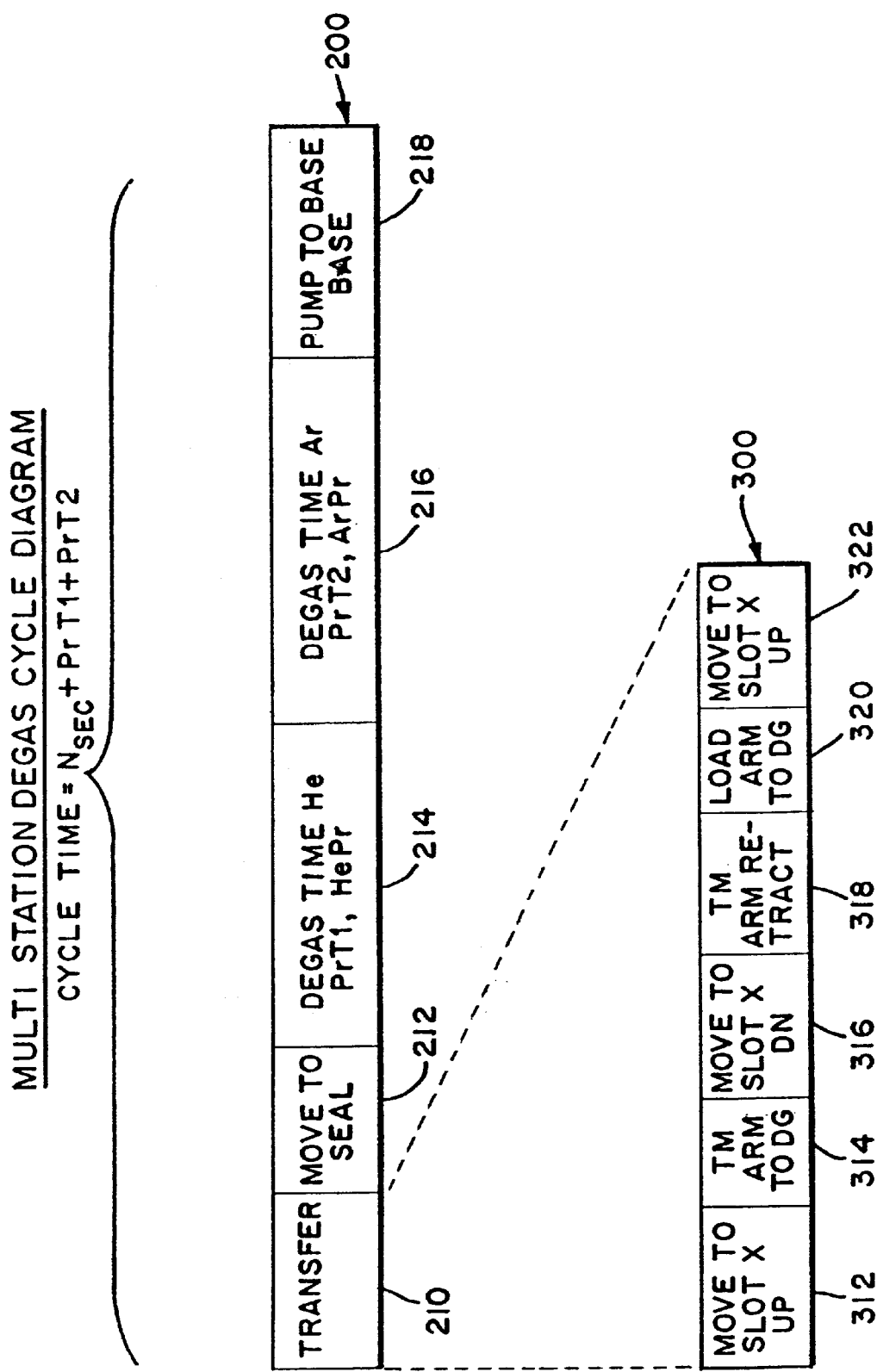
FIG. 4 is a cycle time diagram for the multi-station degas apparatus.

FIG. 4 depicts the cycle time diagram for the multi-station degas apparatus. Preferably, the cycle time is a predetermined time, N seconds, plus time for pressure and temperature shaping of the helium and argon gas introductions, referred to as the step pressure time for each gas. As shown in the upper bar 200, transfer step 210 is the first step in this process. This step is further delineated in the lower bar chart 300. The transfer step 210 requires time to move the stack up to a wafer slot 312. The transfer arm moves to the degas station 314. The stack is moved down to place a wafer on a transfer arm, the transfer arm then retracts. A loader arm loads a wafer 320, and the stack is moved up to unload the wafer 322. Ideally, these actions can be accomplished in approximately ten (10) seconds or less. In the second embodiment, FIG. 7, a wafer may also be removed by the loader arm. Next, the stack is moved into the seal position 212, which will take on the order of two (2) seconds. Helium and argon gases are then introduced at temperature and pressure 214, 216, respectively. The times associated with these step pressures are on the order of 0–1000 seconds. After degas, the system is pumped down to a base pressure 218, which requires only a few seconds to accomplish. Table I depicts the typical range of process parameters for the above-described process.

TABLE 1

PROCESS PARAMETERS

| PROCESS PARAMETER | RANGE |
| --- | --- |
| Heater Temperature | 0–450° C. |
| Temperature Tolerance | 0–100% |
| Degas Time | 0–1000 seconds |

TABLE 1-continued

PROCESS PARAMETERS

| PROCESS PARAMETER | RANGE |
| --- | --- |
| He Process Pressure | 0–15 Torr |
| Ar Process Pressure | 0–15 Torr |
| He Step Pressure Time | 0–1000 seconds |
| Ar Step Pressure Time | 0–1000 seconds |
| Pressure Tolerance | 0–100% |
| Base Pressure | $1(10^{-3})$–$1(10^{-4})$ Torr |
| Purge Time | 0–1000 seconds |
| Transfer Pressure | $0.5$–$1(10^{-5})$ Torr |

Wafer Routing

Figure 5:
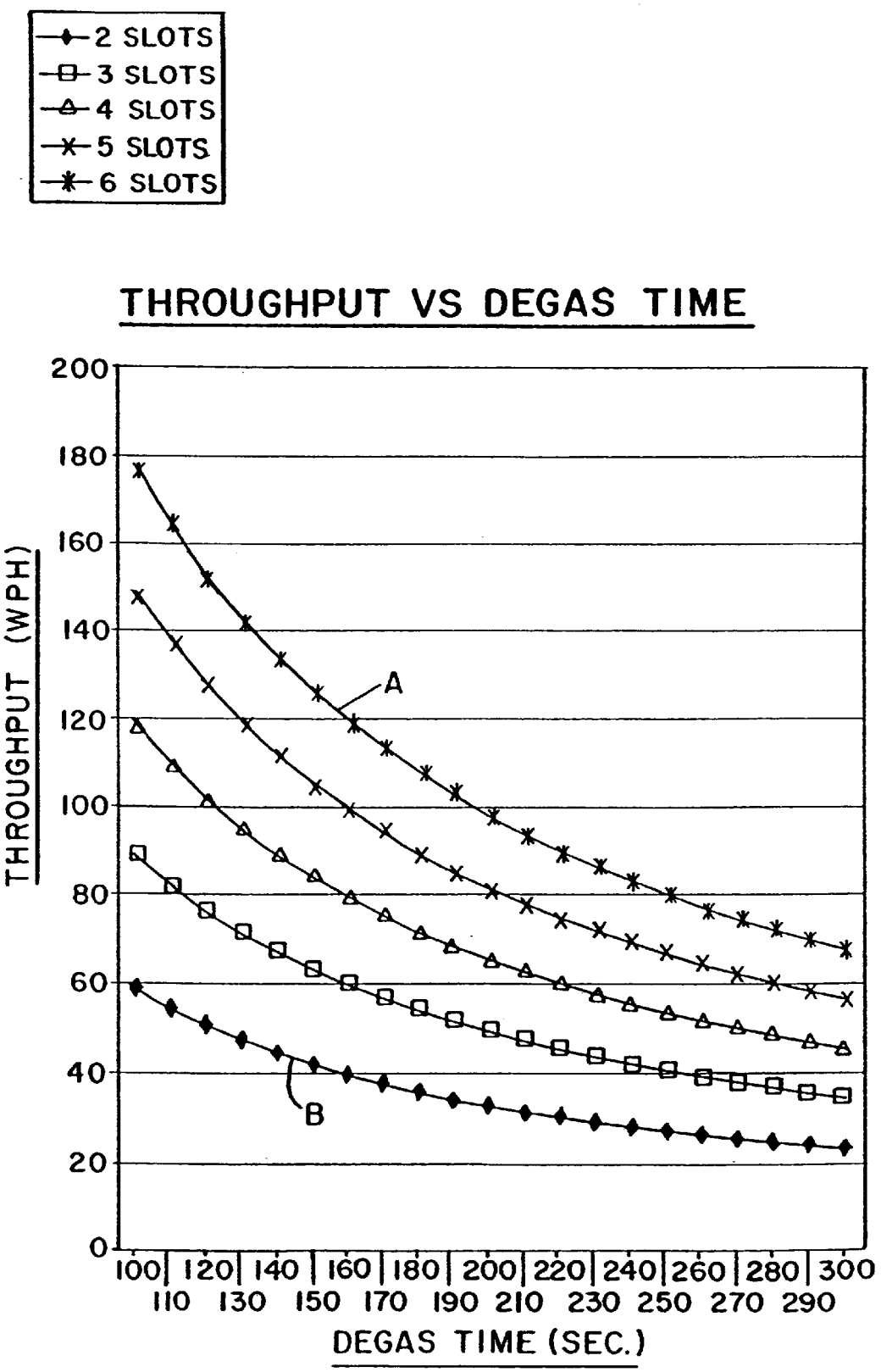
FIG. 5 depicts a throughput characterization curve for the utilization of 2, 3, 4, 5 and 6 slots.

Certain operational mechanics must be considered and controlled in an effort to enhance the efficiency of the multi-station degas system, and the repeatability of the degas process. The stack 16 comprises a plurality of slots in which a wafer can be placed during a steady-state degas operation. The throughput will be maximized for a given degas time at full utilization of the available slots. FIG. 5 depicts a throughput characterization curve for the utilization of 2, 3, 4, 5 and 6 slots, respectively, for the degas process. As shown, curve A, indicating the use of six slots in the stack, allows for a throughput from approximately 180 wafers per hour to 70 wafers per hour over a respective range of degas times from 100 to 300 seconds. Curve B, depicting a throughput characterization with two slots utilized, illustrates the result that the fewer slots employed, the lower the throughput.

There remains, however, a limiting factor for full utilization. Specifically, if the back end of the tool is operating at a lower throughput, the degas step will be in a "wait" state after completion of each cycle. Since the back end throughput may be variable from process to process, or within a single process, the degas process will vary in duty cycle, defined as the time at pressure divided by the overall cycle time ($t_p/t_{cycle}$). To ensure degas process repeatability, it is advantageous to limit the throughput at the degas step. For example, using the throughput characterization curve of FIG. 5, where a 180 second degas is desired and the deposition processes yields 60 wafers per hour, a six slot utilization would not be optimal because the cycle times are too short, requiring the degas to wait for the back end. The wafers would not be ready for degas when the degas process was ready for wafers. In this case, a three slot utilization is closer to the back end throughput, and becomes the throughput limiter at 53 wafers per hour.

Figure 6:
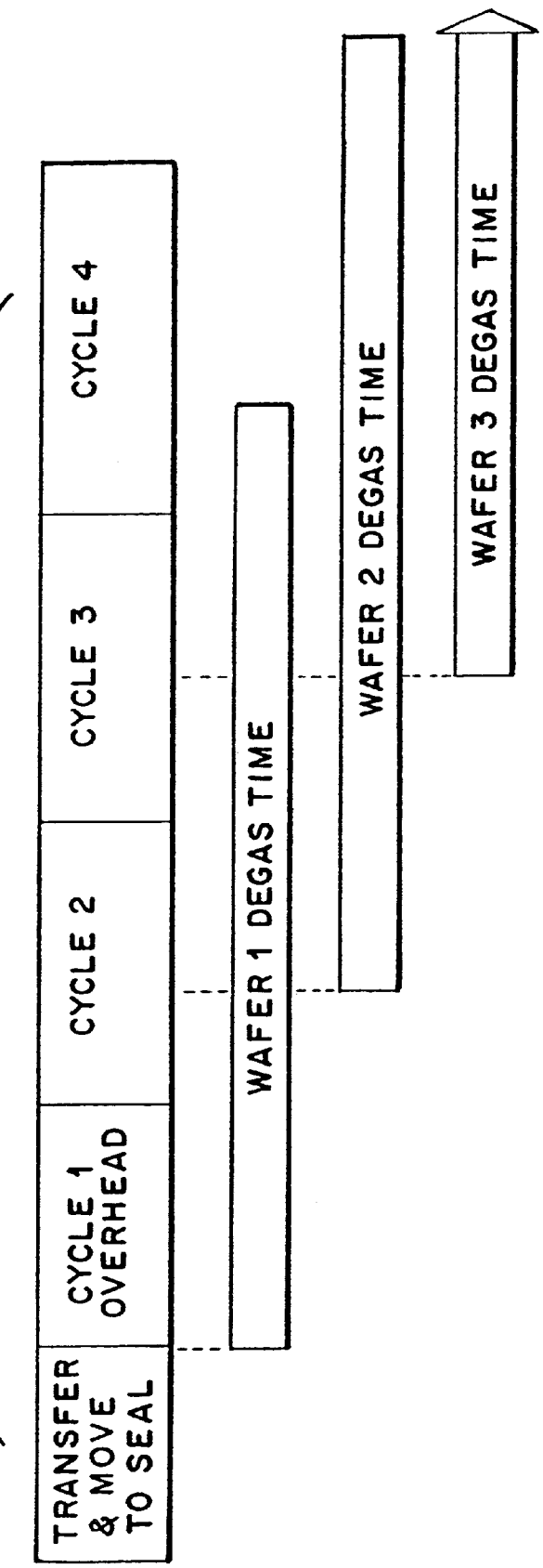
FIG. 6 is a diagram of the wafer degas cycle schedule.

It is also desirable to ensure that wafer-to-wafer process repeatability is maintained throughout many system recipes. This requires the process cycle time to be defined by the process program parameters. In this manner, the time that each wafer will experience pressure will remain consistent, no matter if the degas station is the throughput limiter or not. A wafer degas cycle diagram is depicted in FIG. 6. Each wafer will experience a number of cycles that are defined by the process program before they are removed from the degas station.

The multi-station degas scheduling rules are divided into three distinct groups: "put" rules, "pick" rules, and degas rules. "Put" rules refer to the placement of wafers within the stack. Degas slots available to put the wafer therein are designated as required slots, preferred slots, avoidable slots, or forbidden slots. The wafer recipe must match the wafers in the degas with respect to the following: a) temperature; b) cycle time; c) number of cycles; and d) required slot number. If there are no wafers to put into the stack, the cycle will invoke the degas process again. "Pick" rules refer to the selection of wafers from the stack. Four conditions must be met for this selection. First, the wafer must have completed degassing in order to be picked from the stack. Second, only one wafer may be selected or picked from each degas cycle. Third, the first wafer in is the first wafer to be removed. Lastly, when there is a wafer that has completed degassing, the degas station will wait for the transfer arm to pick the wafer before initiating another cycle. The degas schedule requires each wafer to complete a predetermined number of cycles to complete the degas process, wherein cycle time is defined by the process program.

In the second embodiment, FIG. 7, the heater stack for the 300 mm degas apparatus does not seal to a top surface or plate. Rather, it is open to the degas chamber, which remains isolated from the loader and transfer chambers. Two 300 mm multi-station (MS) degas modules 401 are depicted in FIG. 7. A wafer can be passed from the loader chamber 403 to the MS degas chamber 401 after process taken by the transfer chamber 405 robot arm 407. The wafer may also be taken or transferred after process by the loader chamber robot arm 409.

Figure 8C:
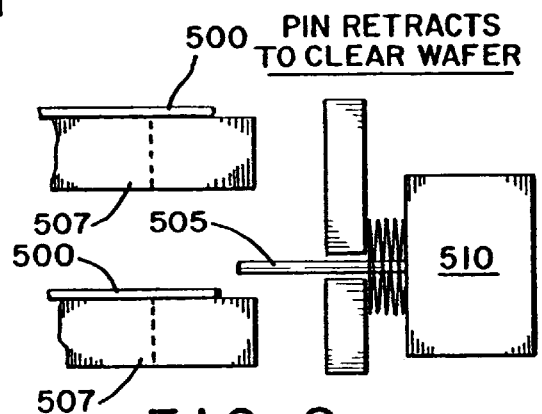
FIG. 8 is a diagram depicting the retractable pins for wafer placement in the multi-station degas apparatus.
Figure 8A:
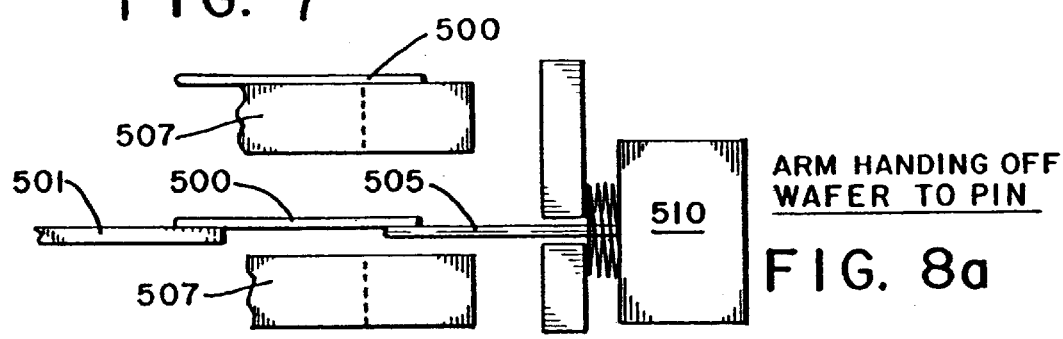
Figure 8B:
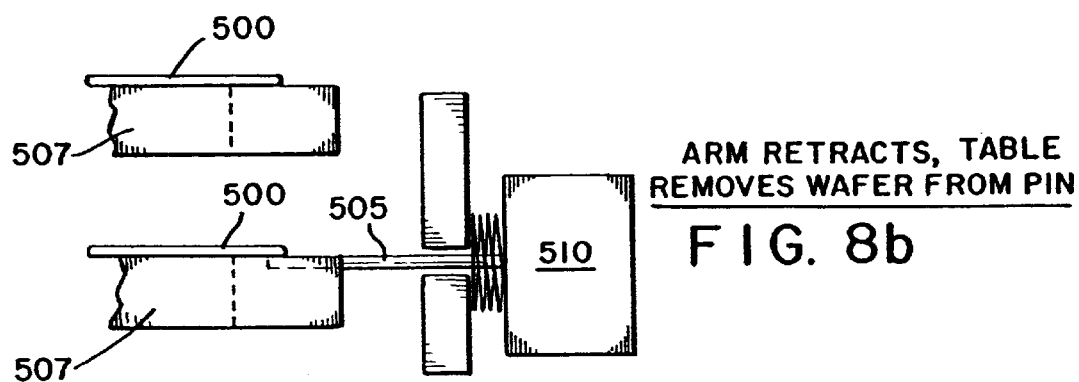

In the 300 mm degas apparatus embodiment, wafers may be place on the multi-station degas heaters directly, increasing the heat transfer efficiency. This is performed by using pins internal to the chamber as shown in FIG. 8a. The loader arm 501 places the wafer 500 on the pins 505. The heated table 507 raises to take the wafer off the pins, FIG. 8b. Arm 501 then retracts. The pins are then retracted by a linear actuator 510, FIG. 8c. Placement of the wafers directly on the table facilitates wafer temperature ramp-up. The reverse is done for removing the wafer from the pedestal. In the first embodiment, the wafer is typically placed on stand-offs. A stand-off configuration may also be employed in the second embodiment.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of degassing semiconductor wafers in a multi-station degas apparatus, comprising:

lowering a heater and wafer holder assembly stack having slots for individual semiconductor wafers into a transfer/load chamber;

loading a wafer into said heater and wafer holder assembly slot;

removing at least one wafer from said heater and wafer holder assembly slot, such that the removed wafer may be individually processed while other wafers remain in said heater and wafer holder assembly; and, positioning said heater and wafer holder assembly into a degas chamber for degas treatment while the at least one removed wafer is exposed to other process steps in other stations of said multi station degas apparatus.

2. The method of claim 1 further comprising:

monitoring the temperature inside said slots through thermocouple channels from said heater and wafer holder assembly stack, monitoring and displaying said temperature using a user interface electrical connection.

3. The method of claim 1 wherein said degas treatment further includes heating said wafers by conduction and radiation heating using resistive heating elements in each of said heaters of said heater and wafer holder assembly stack.

4. The method of claim 1 wherein loading said wafer comprises loading a single wafer at a time using a load robotic arm.

5. The method of claim 1 wherein removing a wafer comprises removing a single wafer at a time using a transfer robotic arm.

6. The method of claim 1 wherein removing a wafer comprises removing a single wafer at a time using a transfer robotic arm and a load robotic arm.

7. The method of claim 1 wherein said degas treatment comprises increasing the internal pressure of said degas chamber to above 1 Torr.

8. The method of claim 7 further comprising introducing helium and argon gases to said degas chamber to increase said internal pressure.

9. The method of claim 1 further comprising isolating said wafers to be degassed by sealing said heater and wafer holder assembly within said degas chamber using a vacuum o-ring seal.

10. The method of claim 1 further comprising air cooling said heaters in said heater and wafer holder assembly stack to enable faster access to the assembly for maintenance purposes.

11. A method of degassing semiconductor wafers in a multi-station degas apparatus, comprising:

positioning a heater and wafer holder assembly stage having a plurality of wafer slots in a sequential manner through each of said wafer slots to the next available wafer slot;

removing a first of a plurality of wafers from one of said wafer slots using a transfer robotic arm after said wafer has been subjected to a degas treatment in a degas chamber;

re-positioning said heater and wafer holder assembly stage to receive a second wafer from said loader robotic arm;

loading said second wafer in an available wafer slot using said loader robotic arm after said first wafer has been removed;

retracting said robotic arms;

sealing said heater and wafer holder assembly stage into said degas chamber; and degassing said second wafer in said heater and wafer holder assembly while said first wafer is subjected to other process stations within said multi-station degas apparatus.

12. The method of claim 11 further comprising lowering said heater and wafer holder assembly stage after process gases have been removed from said degas chamber and a predetermined base transfer pressure has been attained.

13. The method of claim 12 wherein said degas process steps are repeated until each of said plurality of wafers in said heater and wafer holder assembly slots has been degassed and processed.

14. The method of claim 11 wherein said degassing of said wafers further comprises:

closing a vacuum pump isolation valve;

introducing process gases;

initiating a timer;

controlling pressure in said degas chamber; and, opening a by-pass valve after said degas chamber reaches a predetermined internal pressure.

15. The method of claim 14 wherein said process gases include helium and argon gases.

16. The method of claim 14 further comprising pumping down said degas apparatus using a point-of-use roughing pump.

17. The method of claim 14 wherein said introduction of said process gases is ceased when said timer reaches a predetermined timed value.

18. The method of claim 17 further including opening a vacuum valve at said predetermined timed value to remove said gas in said degas chamber.

19. A multi-station degas apparatus for semiconductor wafer processing, comprising:

a process degas chamber;

a load/transfer chamber;

a heater and wafer holder assembly stack having a plurality of slots, said heater and wafer holder assembly stack positionable within said degas chamber and said load/transfer chamber;

a conduction heater in each of said plurality of slots for individual conduction heating of said wafers, a vertical motion bar and platform capable of moving said heater and wafer holder assembly stack to and from said chambers;

at least two robotic arms for placing and removing wafers from said heater and wafer holder assembly stack;

gas inlets for introducing process gases to said degas chamber;

an o-ring positioned to seal said heater and wafer holder assembly stack and said platform when said heater and wafer holder assembly stack is raised into said degas chamber;

a turbo-pump to extract water vapor and other contaminants from said degas chamber; and, pressure, temperature and positioning control devices.

20. The apparatus of claim 19 wherein said robotic arms are capable of accessing each station of said multi-station degas apparatus.

21. The apparatus of claim 19 further comprising servo positioning electronics to position and control the location of said heater and wafer holder assembly stack and said robotic arms.

22. The apparatus of claim 19 wherein said conduction heater comprises a heater stack having a plurality of individual heater plates, and provides for radiation heating along with conduction heating.

23. The apparatus of claim 22 wherein said heater plates are powered by a single power source input to said heater and wafer holder assembly stack.

24. The apparatus of claim 19 wherein said multi-station degas chamber comprises a plurality of stations, including one of said stations for degassing.

25. The apparatus of claim 24 further comprising a motion controller to control the positioning said robotic arms.

26. The apparatus of claim 19 wherein said conduction heater further comprises an air-cooling channel running therethrough.

27. The apparatus of claim 19 further comprising a point-of-use roughing pump to pump down said chamber.

28. The apparatus of claim 19 further comprising retractable pins for placing said wafers on said heater and wafer holder assembly stack.

* * * * *

UNITED STATES PATENT AND TRADEMARK OFFICE
CERTIFICATE OF CORRECTION

PATENT NO.    : 6,497,734 B1
DATED         : December 24, 2002
INVENTOR(S)   : K. Barber et al.

It is certified that error appears in the above-identified patent and that said Letters Patent is hereby corrected as shown below:

<u>Column 8,</u>
Line 47, after "having" insert -- a plurality of heaters and --.

<u>Column 9,</u>
Line 11, delete "and" and substitute therefore -- or --.
Line 37, delete "said" and substitute therefore -- a --.

<u>Column 10,</u>
Line 23, delete "said".
Line 54, delete "chamber" and substitute therefore -- apparatus --.
Line 56, after "positioning" insert -- of --.

Signed and Sealed this

Seventeenth Day of June, 2003

JAMES E. ROGAN
*Director of the United States Patent and Trademark Office*